United States Patent [19]

Seki et al.

[11] Patent Number: 5,831,567
[45] Date of Patent: Nov. 3, 1998

[54] METHOD AND SIGNAL PROCESSING APPARATUS FOR GENERATING DIGITAL SIGNAL FROM ANALOG SIGNAL

[75] Inventors: Hideo Seki, Saitama; Hiroshi Abe, Kanagawa, both of Japan

[73] Assignee: Honda Giken Kogyo Kabushiki Kaisha, Tokyo, Japan

[21] Appl. No.: 895,994

[22] Filed: Jul. 17, 1997

[30] Foreign Application Priority Data

Dec. 27, 1996 [JP] Japan .................................... 8-358319

[51] Int. Cl.$^6$ ...................................................... H03M 1/36
[52] U.S. Cl. ........................................... 341/155; 341/159
[58] Field of Search ................................. 341/156, 159, 341/155, 161, 158, 157

[56] References Cited

U.S. PATENT DOCUMENTS

5,706,008  1/1998  Huntley et al. ..................... 341/156
5,721,548  2/1998  Choe et al. .......................... 341/118

Primary Examiner—Brian K. Young
Attorney, Agent, or Firm—Sughrue, Mion, Zinn, Macpeak & Seas, PLLC

[57] ABSTRACT

In a signal processing apparatus, an analog signal inputted from, for example, a sensor is amplified by a amplifying circuit and is supplied to N comparing circuits (N is an integer equal to or more than 2). Each of the N comparing circuits is associated with a reference voltage and generates a comparison resultant signal based on the reference voltage in response to the amplified analog signal. N pulse generating circuits are provided for the N comparing circuits, respectively, and each of the N pulse generating circuits generates first and second pulse signals which indicate level transitions of the comparison resultant signal with respect to the corresponding reference voltage. A digital signal generating circuit composed of a flip-flop circuit generates a digital signal in response to the first and second pulse signals from each of the N pulse generating circuits.

20 Claims, 11 Drawing Sheets

SIGNAL $C_i$

Fig. 15B

SIGNAL $SS_i$

Fig. 15C

SIGNAL $SR_i$

Fig. 15D

SIGNAL R

Fig. 17A
SIGNAL C₁

Fig. 17B
SIGNAL C₂

Fig. 17C
SIGNAL SS₁

Fig. 17D
SIGNAL SS₂

Fig. 17E
SIGNAL SR₁

Fig. 17F
SIGNAL SR₂

Fig. 17G
SIGNAL R

METHOD AND SIGNAL PROCESSING APPARATUS FOR GENERATING DIGITAL SIGNAL FROM ANALOG SIGNAL

BACKGROUND OF THE INVENTION

1. Field of the Invention

The present invention relates to a method and signal processing apparatus for generating a digital signal based on an analog signal which is supplied from an external device, and more particularly, to a method and signal processing apparatus for generating a digital signal based on an alternating current (AC) signal component contained in an analog signal.

2. Description of the Related Art

Conventionally, various sensors are used in various apparatuses. Generally, the sensor detects a predetermined a physical or chemical change of an object and converts this into an analog signal to outputs it.

On the other hand, the development of digital signal processing technique in recent years is remarkable. Because a digitized signal is suitable for processing by a computer, the digital signal processing technique tends to be adopted in a signal processing field, in order to realize an advanced process function.

Figure 1:
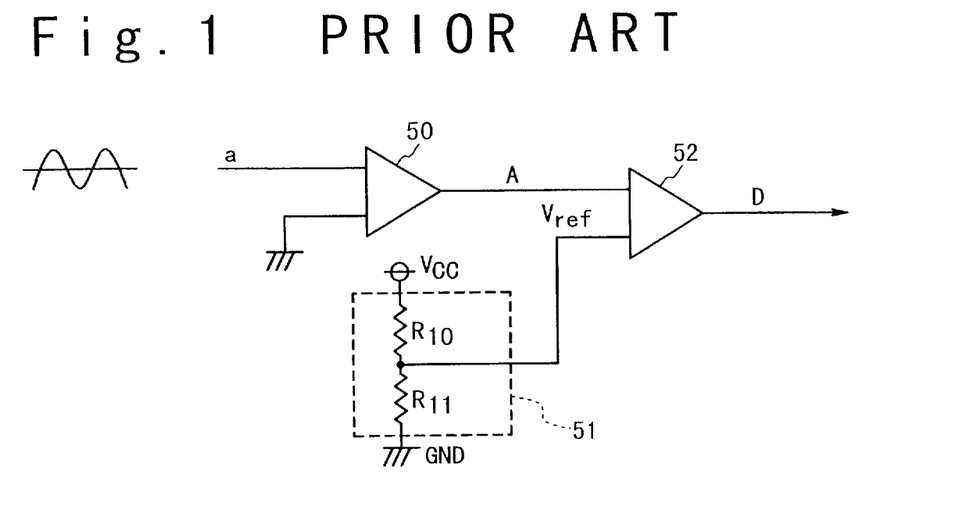
FIG. 1 is a circuit diagram illustrating the structure of a first conventional signal processing apparatus to generate a digital signal from an analog signal.

To convert an analog signal obtained from a sensor into a digital signal, it is necessary to digitize the analog signal. As the apparatus for digitizing an analog signal from the sensor, a signal processing apparatus as shown in, for example, FIG. 1 is conventionally known. The signal processing apparatus is composed of an amplifying circuit 50 for amplifying an analog signal a from a sensor (not shown), a reference voltage generating circuit 51 for generating a reference voltage $V_{ref}$, and a comparing circuit 52 for comparing an analog signal A from amplifying circuit 50 and the reference voltage $V_{ref}$ from the reference voltage generating circuit 51. Each of the amplifying circuit 50 and the comparing circuit 52 is composed of an operational amplifier. Also, the reference voltage generating circuit 51 is a resistor division circuit which is composed of a resistor R10 and a resistor R11 which are provided between a power supply voltage $V_{cc}$ and a ground voltage GND. The reference voltage $V_{ref}$ is generated from the connection point between both the resistors.

Figure 2A:
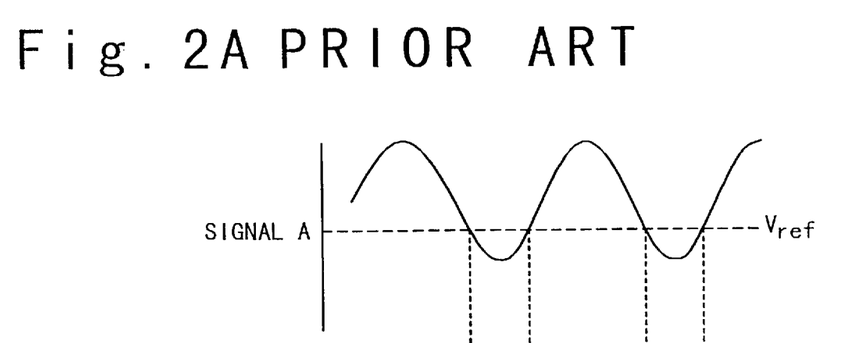
FIGS. 2A and 2B are timing charts to explain the operation of the first conventional signal processing apparatus.
Figure 2B:
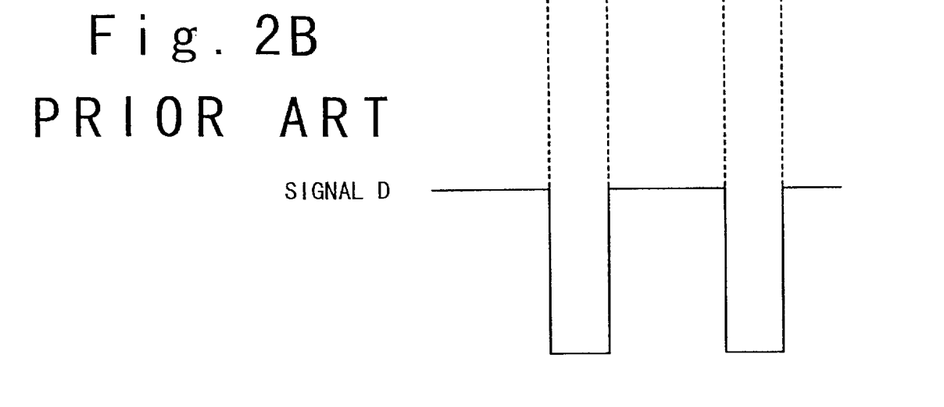

In such a signal processing apparatus, the analog signal a from the sensor is supplied to one of terminals of the amplifying circuit 50 as a first stage. The other terminal of the amplifying circuit 50 is grounded. The analog signal A obtained by amplifying the analog signal a by the amplifying circuit 50 is supplied to one of input terminals of the comparing circuit 52. Also, the reference voltage $V_{ref}$ generated by the reference voltage generating circuit 51 is supplied to the other input terminal of the comparing circuit 52. The comparing circuit 52 outputs a signal D of a high level (hereinafter, to be referred to as "the H level"), when the amplitude of the analog signal A is larger than the reference voltage $V_{ref}$, and outputs the signal D of a low level (hereinafter, to be referred to as "the L level"), otherwise. By this, the analog signal a from the sensor is converted into the digital signal D, as shown in FIGS. 2A and 2B.

Figure 3:
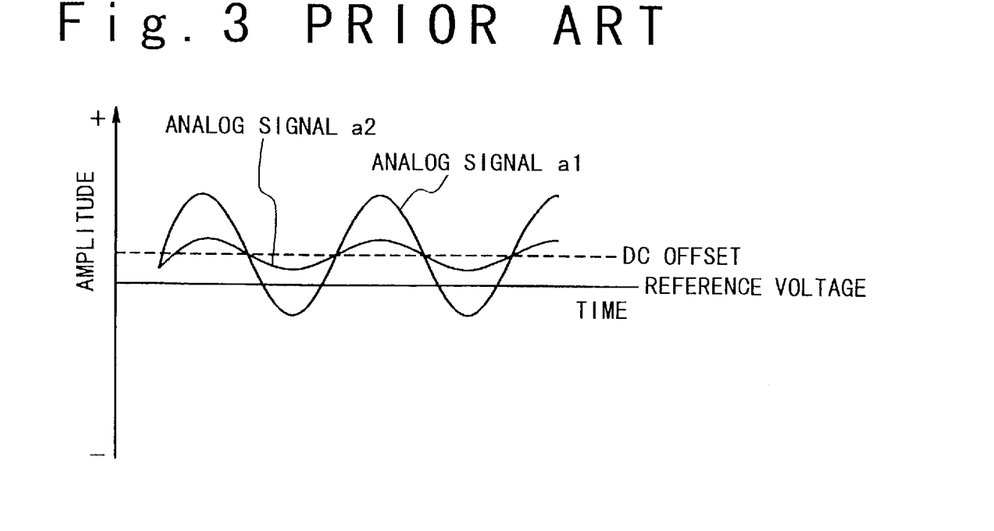
FIG. 3 is a timing chart to explain a problem of the first conventional signal processing apparatus.

By the way, a DC component is generally contained in the analog signal a obtained from the sensor, in addition to an AC component. In the conventional signal processing apparatus, because the DC offset is not considered, there is a problem in that the above-mentioned conventional signal processing apparatus is inferior in point of the ability to detect a signal. For example, there is no problem if the amplitude of the AC component is sufficiently larger than the DC offset, like an analog signal a1 of FIG. 3. However, if the amplitude is smaller than the DC offset, like an analog signal a2, the analog signal a2 does not cross the reference voltage $V_{ref}$. In this case, the change of the analog signal a2 can not be detected.

Figure 4:
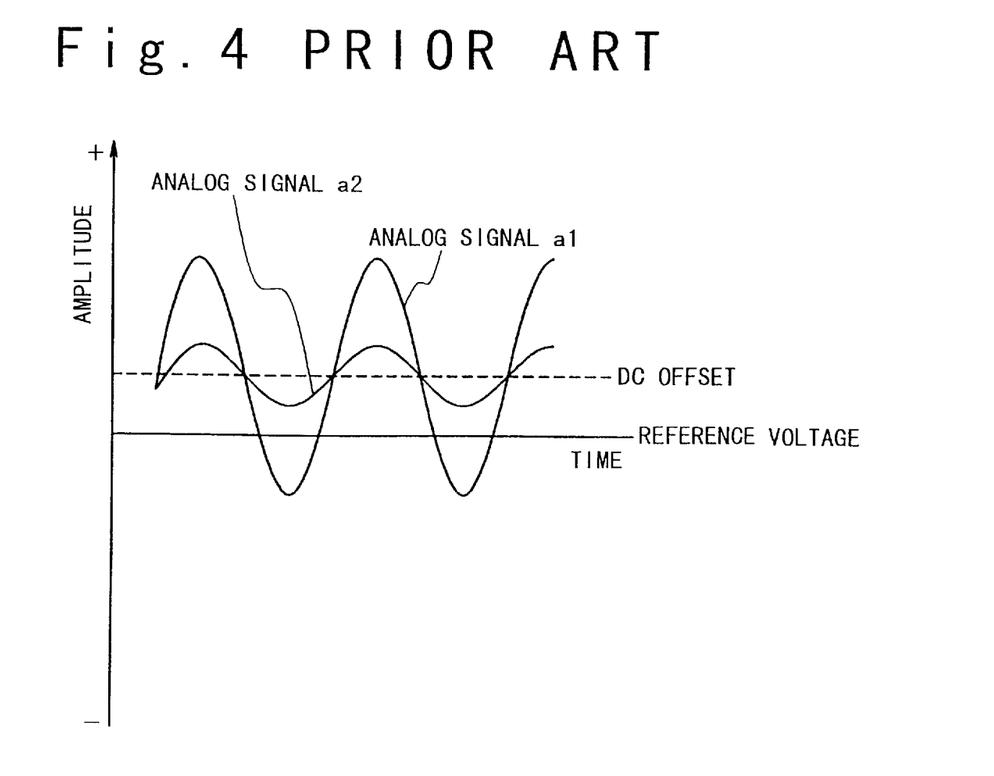
FIG. 4 is a timing chart to explain the problem of the first conventional signal processing apparatus.

In order to solve a problem as described above, the amplitude of the AC component of the analog signal a obtained from the sensor should be made large. For this purpose, if the analog signal a obtained from the sensor is simply amplified by the amplifier, the amplitude of the analog signals a1 and a2 becomes large, as shown in FIG. 4. However, because the DC offset is also amplified when the analog signal is simply amplified, the amplified analog signal A2 does not still cross the reference voltage $V_{ref}$. When a signal is actually amplified by the amplifier, a situation is more aggravated, because a DC offset of amplifier itself is also superposed on the amplified signal.

For this reason, conventionally, after a signal processing apparatus is manufactured, adjustment, i.e. trimming is performed in which an analog signal is actually inputted to the signal processing apparatus for measurement of a DC offset, and the reference voltage $V_{ref}$ is set to an optimal value based on the measurement result. Thus, there is a problem in that the adjustment is very troublesome and high cost adjustment facilities are necessary.

Figure 5:
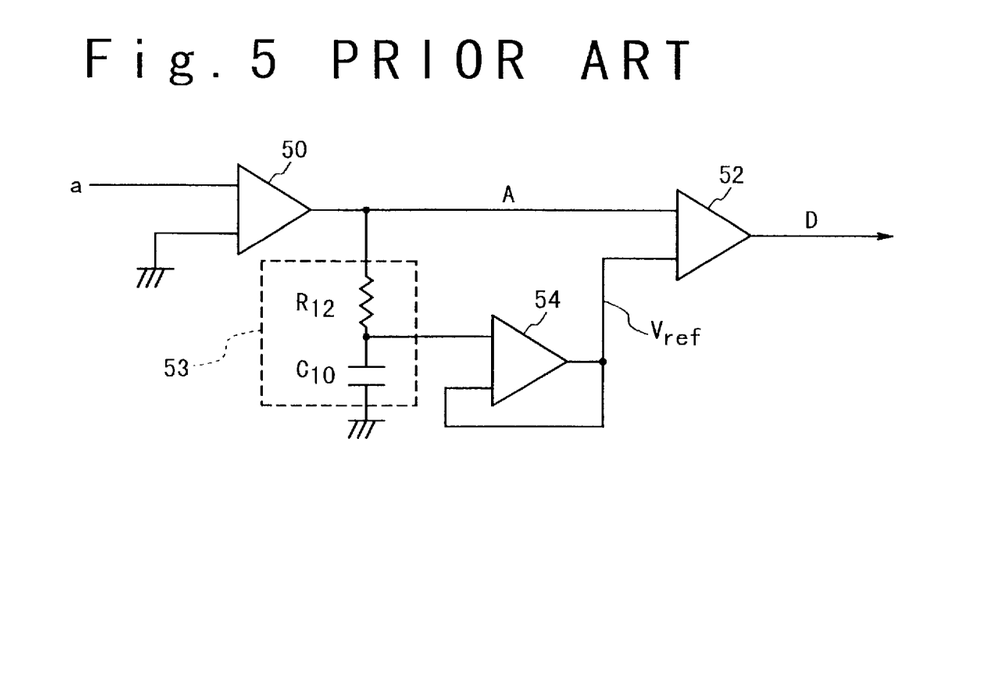
FIG. 5 is a circuit diagram illustrating the structure of a second conventional signal processing apparatus to generate a digital signal from an analog signal.

In order to eliminate the problem caused by the DC offset, a signal processing apparatus as shown in, for example, FIG. 5 is developed. The signal processing apparatus is composed of an amplifying circuit 50 for amplifying an analog signal a from a sensor (not shown), an integrating circuit 53 for smoothing the output signal of the amplifying circuit 50, a buffer circuit 54 for outputting the output signal from the integrating circuit 53 as the reference voltage $V_{ref}$, and a comparing circuit 52 for comparing an analog signal A from the amplifying circuit 50 and the reference voltage $V_{ref}$ from the buffer circuit 54. Note that the same components as those shown in FIG. 1 are allocated with the same reference numerals. Each of the amplifying circuit 50, the buffer circuit 54, and the comparing circuit 52 is composed of an operational amplifier. Also, the integrating circuit 53 includes a CR integrating circuit which is composed of a resistor R12 and a capacitor C10.

Figures 6A, 6B:
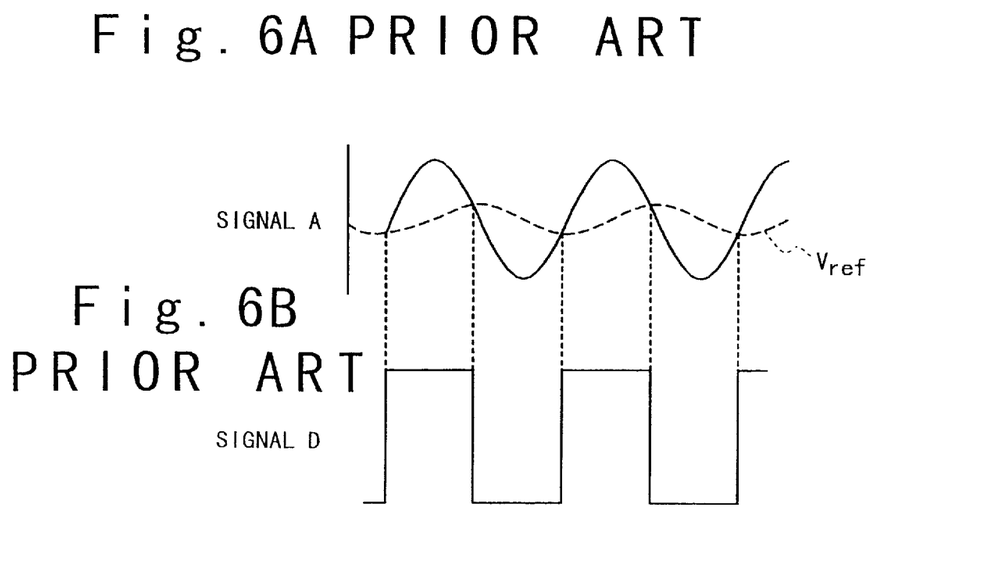
FIGS. 6A and 6B are timing charts to explain the operation of the second conventional signal processing apparatus.

In this signal processing apparatus, the analog signal a from the sensor is supplied to the amplifying circuit 50. Then, an analog signal A obtained by amplifying the analog signal a by the amplifying circuit 50 is supplied to one of input terminals of the comparing circuit 52 and the integrating circuits 53. The integrating circuit 53 integrates the analog signal A and supplies the integrating result to the buffer circuit 54. The output of the buffer circuit 54 is supplied to the other input terminal of the comparing circuit 52 as the reference voltage $V_{ref}$. The operation of the comparing circuit 52 is the same as that of the above-mentioned comparing circuit 52 shown in FIG. 1. By this, the analog signal a from the sensor is converted into a digital signal D, as shown in FIGS. 6A and 6B.

According to this signal processing apparatus, since the reference voltage $V_{ref}$ is generated from the AC component of the analog signal A to be compared, the analog signal A and the reference voltage $V_{ref}$ can be compared irrespective of the DC offset which is contained in the analog signal A. In accordance with, the problems caused by the above-mentioned DC offset can be solved.

However, the capacity of the capacitor C10 used for the integrating circuit 53 must be made large such that the signal processing apparatus can function correctly even when the AC component of the analog signal A has a low frequency. For example, when a physical quantity of a rotating section in a car is detected by the sensor, the minimum frequency of the AC component of the analog signal which is obtained from the sensor becomes several Hz. In this case, because the capacity of the capacitor C10 of several $\mu$F and tens of $\mu$F is necessary, the cost has become high. Also, it is difficult to form a large capacity of capacitor in the integrated circuit. Therefore, it is difficult to manufacture the signal processing apparatus as the integrated circuit.

Figure 7:
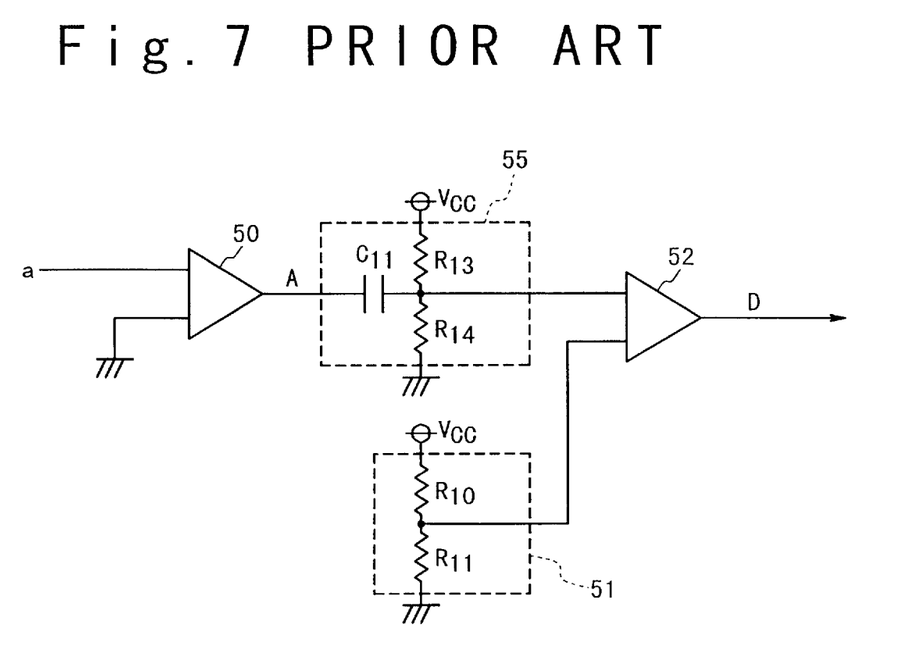
FIG. 7 is a circuit diagram illustrating the structure of a third conventional signal processing apparatus to generate a digital signal from an analog signal.

Further, in order to eliminate the problem caused by the above-mentioned DC offset, for example, the other signal processing apparatus as shown in FIG. 7 is developed. In the signal processing apparatus, a highpass filter 55 is inserted between the amplifying circuit 50 and the comparing circuits 52 to amplify an analog signal a from the sensor as shown in FIG. 1. Note that the same components as those shown in FIG. 1 are allocated with the same reference numerals. The highpass filter 55 takes out only the AC component contained in the analog signal A, and supplies only the taken AC component to the comparing circuit 52.

According to this signal processing apparatus, since the reference voltage $V_{ref}$ is compared only with the AC component in the analog signal A, the problem caused by the above-mentioned DC offset is eliminated. However, the large capacity of capacitor is necessary for the capacitor C11 which is used for the highpass filter 55. Therefore, there is the same problem as in the signal processing apparatus as shown in FIG. 5.

SUMMARY OF THE INVENTION

A present invention is accomplished in the light of the above circumstances. Therefore, an object of the present invention is to provide a method of processing a signal and a signal processing apparatus for the same, in which a digital signal can be generated from an analog signal supplied from a sensor and so on without any adjustment after the manufacture.

Another object of the present invention is to provide a signal processing apparatus which can be manufactured with low cost and is suitable for an integrated circuit.

Still another object of the present invention is to provide a method of generating a digital signal from an analog signal without any influence of noise and a signal processing apparatus for the same.

In order to achieve an aspect of the present invention, a signal processing apparatus includes N comparing circuits (N is an integer equal to or more than 2) respectively associated with reference voltages, wherein each of the comprising circuits generates a comparison resultant signal based on the associated reference voltage in response to input of a first analog signal, N pulse generating circuits respectively provided for the N comparing circuits, wherein each of the N pulse generating circuits generates first and second pulse signals based on the corresponding comparison resultant signal supplied from the corresponding comparing circuit, the first and second pulse signals indicating signal level transitions of the corresponding comparison resultant signal with respect to the associated reference voltage, and a digital signal generating circuit for generating a digital signal in response to the first and second pulse signals of each of the N pulse generating circuits. The signal processing apparatus may further include an amplifying circuit for amplifying an inputted second analog signal to supply to the N comparing circuits as the first analog signal.

In this case, the second analog signal includes a DC offset, and a voltage difference Vd between adjacent two of the reference voltages associated with the N comparing circuits satisfies:

$$Vd \leq \alpha\gamma \text{ and } Vd \geq \beta\gamma/N$$

where $\alpha$ is an amplitude of a component of the second analog signal other than the DC off set, $\beta$ is the DC offset of the second analog signal, $\gamma$ is an amplification of the amplifying circuit. Each of the N comparing circuits may have a hysteresis characteristic.

Also, each of the N pulse generating circuits may include a prevention circuit section for preventing an erroneous operation due to a pulse-like noise. In this case, each of the N pulse generating circuits includes a first pulse generating circuit for generating the first pulse signal which indicates a first level transition of the corresponding comparison resultant signal with respect to the associated reference voltage into a first direction, and a second pulse generating circuit for generating the second pulse signal which indicates a second level transition of the corresponding comparison resultant signal with respect to the associated reference voltage into a second direction which is opposite to the first direction. Each of the first and second pulse generating circuits includes an integrating circuit. More particularly, the first pulse generating circuit generates the first pulse signal simultaneously with the first level transition of the corresponding comparison resultant signal into the first direction, and the second pulse generating circuit generates second pulse signal simultaneously with the second level transition of the corresponding comparison resultant signal into the second direction. The N comparing circuits, the N pulse generating circuits, the digital signal generating circuit, and the amplifying circuit are formed in a same semiconductor chip.

In order to achieve another aspect of the present invention, a method of generating a digital signal from an analog signal containing a DC offset, includes the steps of:

amplifying a first analog signal containing a DC offset to produce a second analog signal;

comparing the second analog signal with each of a plurality of reference voltages to generate a plurality of comparison resultant signals;

generating a first pulse signal in response to a first level transition of each of the plurality of comparison resultant signals from a first level region to a second level region;

generating a second pulse signal in response to a second level transition of each of the plurality of comparison resultant signals from the second level region to the first level region; and generating a digital signal set in response to the plurality of first pulse signals and rest in response to the plurality of second pulse signals.

In order to achieve still another aspect of the present invention, a signal processing apparatus includes a reference voltage generating circuit for generating N reference voltages (N is an integer equal to or more than 2), N comparing circuits respectively provided for the N reference voltages, wherein each of the N comparing circuits compares a first analog signal with the corresponding reference voltage to output a comparison resultant signal in accordance with the comparing result, and the comparison resultant signal has a first level when an amplitude of the first analog signal is larger than the corresponding reference voltage, and a second level when the amplitude of the first analog signal is not larger than the corresponding reference voltage, and a digital signal generating section for generating a digital signal set when either of the N comparison resultant signals which are outputted from the N comparing circuits changes from the second level into the first level and reset when either of the N comparison resultant signals changes from the first level into the second level.

DESCRIPTION OF THE PREFERRED EMBODIMENTS

A signal processing apparatus of the present invention will be described below in detail with reference to the accompanying drawings.

Figure 8:
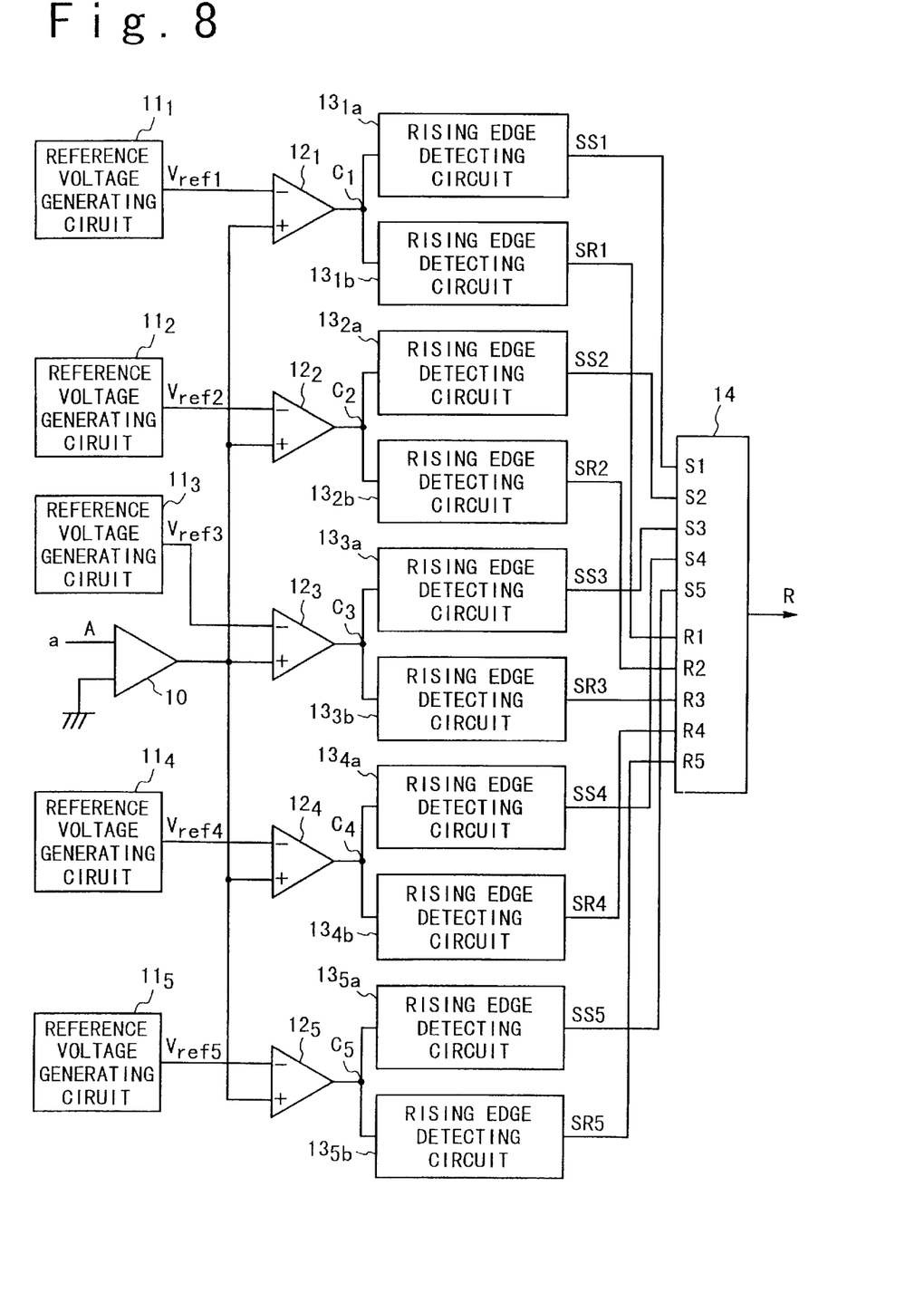
FIG. 8 is a block diagram illustrating the structure of the signal processing apparatus according to an embodiment of the present invention.

FIG. 8 is a block diagram illustrating the structure of the signal processing apparatus according to an embodiment of the present invention. The signal processing apparatus is composed of an amplifying circuit 10, reference voltage generating circuit $11_1$ to $11_5$, comparing circuit $12_1$ to $12_5$, rising edge detecting circuit $13_{1a}$ to $13_{5a}$, falling edge detecting circuit $13_{1b}$ to $13_{5b}$, and a flip-flop circuit 14. In the signal processing apparatus in this embodiment, five kinds of reference voltage $V_{ref}$ is used. These are +400 mV, +200 mV, 0 V, −200 mV and −400 mV. In the following description, when the whole of circuit sections are referred to, a representative circuit section will be described with a suffix of "i".

The reference voltage generating circuit $11_1$ to $11_5$ generates the reference voltage of +400 mV, +200 mV, 0 V, −200 mV and −400 mV as the reference voltages $V_{ref1}$, $V_{ref2}$, $V_{ref3}$, $V_{ref4}$, $V_{ref5}$, respectively. The reference voltage generating circuit $11_1$ is possible to be constructed of the resistor dividing circuit as shown in, for example, FIG. 1. The resistor dividing circuit is composed of resistors which are connected between a positive/negative power supply voltage and a ground potential or the positive and negative power supply voltages, as described in the conventional technique. In the embodiment, the positive and negative power supply voltages are used for the reference voltage generating circuit $11_i$. The reference voltage $V_{refi}$ from the reference voltage generating circuit $11_i$ is supplied to one of input terminals of the comparing circuit $12_i$.

An analog signal a from an external device, e.g., a sensor element is supplied to one of input terminals of the amplifying circuit 10. The other input terminal of the amplifying circuit is connected to a predetermined voltage, e.g., the ground potential. The amplifying circuit 10 is composed of an operational amplifier. The amplifying circuit 10 is not limited to the operational amplifier. For example, the amplifying circuit made from transistors and so on, and the other well-known amplifying circuit can be used. An analog signal A is obtained as a result of amplification by the amplifying circuit 10 and is supplied to "+" input terminal of the comparing circuit $12_i$.

The comparing circuit $12_i$ compares the analog signal A supplied from the amplifying circuit 10 and the reference voltage $V_{refi}$ supplied from the reference voltage generating circuit $11_i$ and outputs the comparing result. Each of the comparing circuits $12_1$ to $12_5$ is composed of an operational amplifier. Each of the comparing circuit $12_1$ to $12_5$ is not limited to the operational amplifier. For example, the comparing circuit may be constructed by a transistor circuit and so on, or may be another well known comparing circuit. The comparing circuit $12_i$ compares the analog signal A supplied from the amplifying circuit 10 and the reference voltage $V_{refi}$ supplied from the reference voltage generating circuit $11_i$. The comparing circuit $12_i$ outputs the comparison resultant signal $C_i$ of the H level, when the analog signal A is larger than the reference voltage $V_{refi}$. The comparing circuit $12_i$ outputs the comparison resultant signal $C_i$ of the L level, when the analog signal A is equal to or smaller than the reference voltage $V_{refi}$. The comparison resultant signal $C_i$ outputted from the comparing circuit $12_i$ is supplied to the rising edge detecting circuit $13_{ia}$ and falling edge detecting circuit $13_{ib}$.

Figure 9:
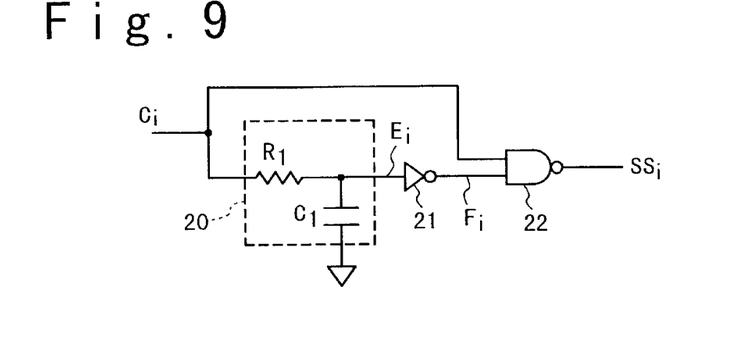
FIG. 9 is a circuit diagram illustrating a structure example of a rising edge detecting circuit shown in FIG. 8.

The rising edge detecting circuit $13_{ia}$ detects the rising edge of the comparison resultant signal $C_i$ from the comparing circuit $12_i$. A detection result is outputted as a pulse signal. The detailed structure of the rising edge detecting circuit $13_{ia}$ is shown in FIG. 9. The rising edge detecting circuit $13_{ia}$ is composed of an integrating circuit 20, an inverter 21 and a 2-input NAND gate 22. The integrating circuit 20 is compose of a resistor R1 and a capacitor C1, and functions as a delay circuit. Also, the integrating circuit functions as the circuit to prevent an erroneous operation due to pulse-like noise.

A comparison resultant signal $C_i$ from the comparing circuit $12_i$ is supplied to one of the input terminals of the NAND gate 22 and the integrating circuit 20. A signal $E_i$ delayed by the integrating circuit 20 is inverted by the inverter 21 and is supplied to the other input terminal of the NAND gate 22 as a signal $F_i$. Then, the logic product of signal $C_i$ and the signal $F_i$ is calculated by the NAND gate 22 and then is inverted. The inverted logic product is outputted as a rising detection signal $SS_i$. By this, when the comparison resultant signal $C_i$ from the comparing circuit $12_i$ changes from the L level to the H level, the pulse signal $SS_i$ having a width of the delay time dependant on the integrating circuit 20 is generated and is outputted. The output signals $SS_1$ to $SS_5$ from the rising edge detecting circuits $13_{1a}$ to $13_{5a}$ are supplied to set terminals $S_1$ to $S_5$ of the flip-flop circuit 14, respectively. The operation of the rising edge detecting circuit $13_{ia}$ will be described later in detail with reference to the timing charts of FIGS. 13A to 13D.

Figure 10:
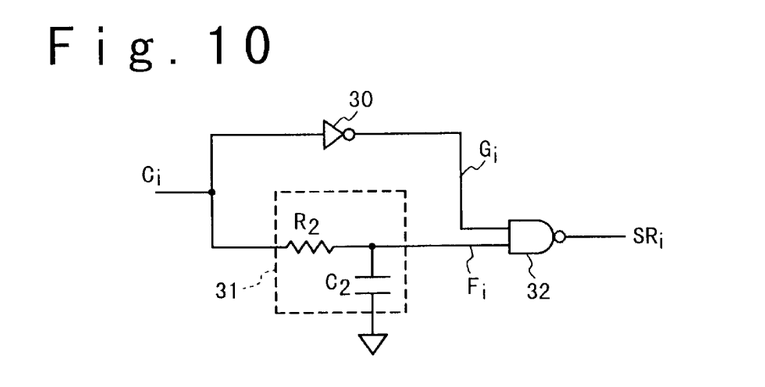
FIG. 10 is a circuit diagram illustrating a structure example of a falling edge detecting circuit shown in FIG. 8.

The falling edge detecting circuit $13_{ib}$ detects the falling edge of the comparison resultant signal $C_i$ from the comparing circuit $12_i$. A detection result is outputted as a pulse signal $SR_i$. The detailed structure of the falling edge detecting circuit $13_{ib}$ is shown in FIG. 10. The falling edge detecting circuit $13_{ib}$ is composed of an inverter 30, an integrating circuit 31, and a 2-input NAND gate 32. The integrating circuit 31 is composed of a resistor R2 and a capacitor C2, and has a signal delay function and a function to prevent an erroneous operation due to pulse-like noise. The comparison resultant signal $C_i$ from the comparing circuit $12_i$ is inverted by the inverter 30 to produce a signal $G_i$ which is supplied to one of the input terminals of the NAND gate 32. Also, the comparison resultant signal $C_i$ is delayed by the integrating circuit 31 and is supplied to the other input terminal of the NAND gate 32 as a signal $H_i$. Then, the logic product of the signal $G_i$ and the signal $H_i$ is calculated by the NAND gate 22 and then is inverted. The inverted logic product is outputted as a falling edge detection signal $SR_i$. By this, when the comparison resultant signal $C_i$ from the comparing circuit $12_i$ changes from the H level to the L level, the pulse signal $SR_i$ having a width of for the delay time is generated and outputted depending on the integrating circuit 31. The output signals $SR_1$ to $SR_5$ from the falling edge detecting circuits $13_{1b}$ to $13_{5b}$ are supplied to the reset terminals $R_1$ to $R_5$ of the flip-flop circuit 14, respectively. The operation of the falling edge detecting circuit $13_{ib}$ will be described in detail with reference to the timing charts of FIGS. 14A to 14D.

It is sufficient that the integrating circuits 20 and 31 in the above rising edge detecting circuit $13_{ia}$ and falling edge detecting circuit $13_{ib}$ can delay the inputted comparison resultant signal $C_i$ by the pulse width necessary to set or reset the flip-flop circuit 14. Therefore, the capacity of the capacitors $C_1$ and $C_2$ in the integrating circuit 20 and 31 is sufficient to be about 0.1. In accordance with, because such a capacitor can be formed in the integrated circuit, the signal processing apparatus can be easily manufactured as an integrated circuit on a same semiconductor chip. Also, the integrating circuit 20 and 31 may be substituted by another delay means. For example, a gating circuit of one stage to a few stages can be used to realize the delay function of the integrating circuit 20 and 31. In this case, the delay time is determined by the signal transfer time of the gating circuit.

Figure 11:
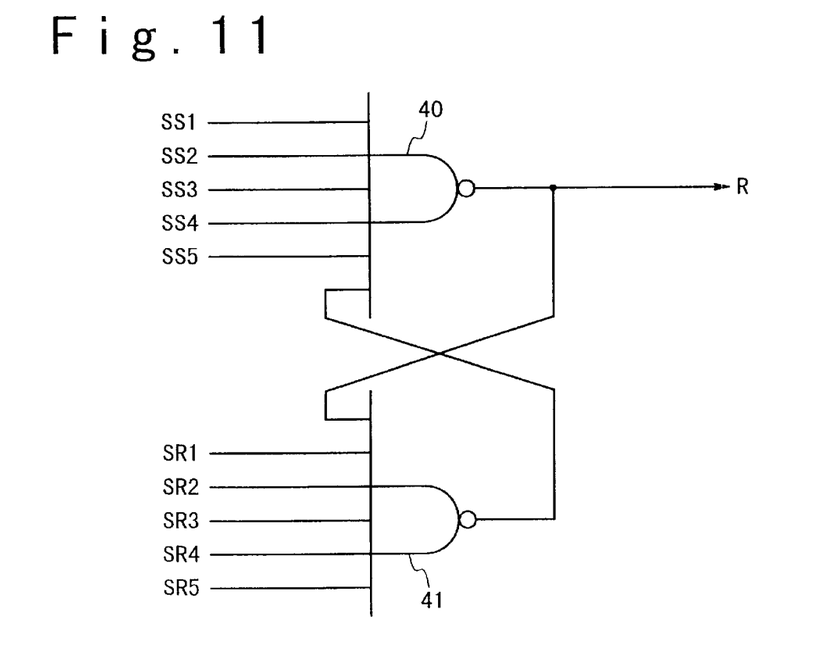
FIG. 11 is a circuit diagram illustrating a structure example of a flip to flop circuit shown in FIG. 8.

The flip-flop circuit 14 is set when the set signal $SS_i$ of the L level is inputted to any of the set terminals $S_1$ to $S_5$, and outputs the digital signal R of the H level. On the other hand, the flip-flop is reset when the reset signal $SR_i$ of the L level is inputted to any one of the reset terminals $R_1$ to $R_5$, and outputs the digital signal R of the L level. The detail of the flip-flop circuit 14 is shown in FIG. 11. The flip-flop circuit 14 is composed of 6-input NAND gates 40 and 41 to form a 5-input SR type of flip-flop. The digital signal R is outputted from the flip-flop circuit 14 to the outside.

Next, the operation of the signal processing apparatus having the above-mentioned structure will be described with reference to the timing charts shown in FIGS. 12A to 17G.

Now, it is supposed that the peak-to-peak amplitude of an AC component of an analog signal supplied from an external device, e.g., a sensor element is 10 $mV_{P-P}$, a DC offset is 13 mV, and the amplification of the amplifying circuit 10 is 20 times.

Figure 12A:
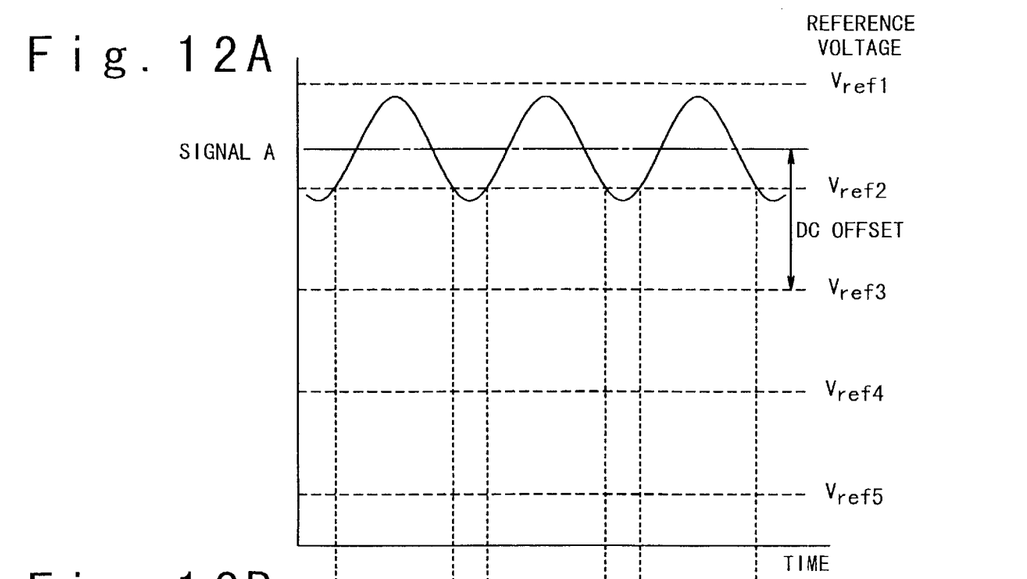
FIGS. 12A to 12F are timing charts to explain the operations of an amplifying circuit and comparing circuit in the signal processing apparatus according to the embodiment of the present invention.
Figure 12B:
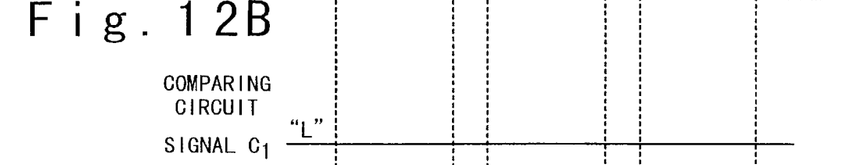
Figures 12C, 12D:
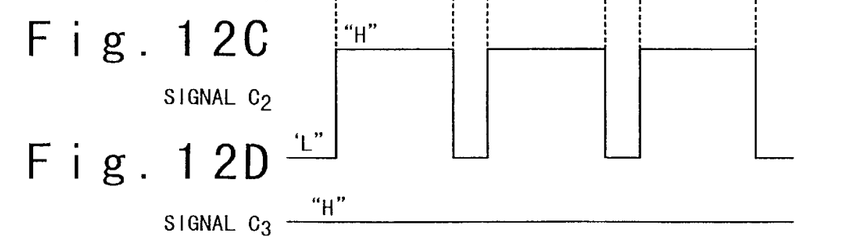
Figure 12E:
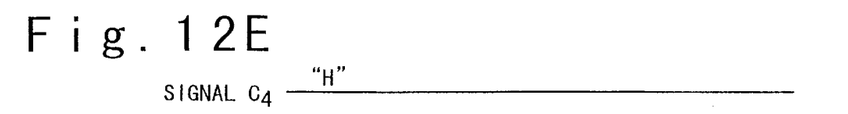
Figure 12F:
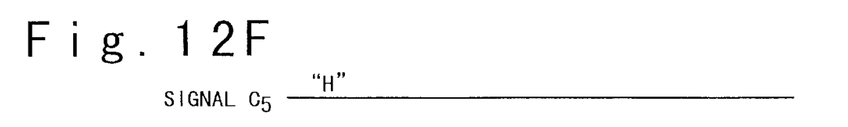

The amplifying circuit 10 amplifies the inputted analog signal a, and outputs the analog signal A having the AC component 200 $mV_{P-P}$ and the DC offset of 260 mV, as shown in FIG. 12A. Accordingly, the analog signal A crosses only the reference voltage of +200 mV, as shown in FIG. 12A. Accordingly, the comparing circuit $12_i$ inputs the analog signal A amplified by the amplifying circuit 10 and always outputs the comparison resultant signal $C_1$ of the L level, because the analog signal A is smaller than the reference voltage of +400 mV, as shown in FIG. 12B. The comparing circuit $12_2$ outputs the comparison resultant signal $C_2$ of the H level when the analog signal A is larger than the reference voltage of +200 mV, and outputs the comparison resultant signal $C_2$ of the L level when the analog signal A is smaller than the reference voltage of +200 mV, as shown in FIG. 12C. The comparing circuits $12_3$ to $12_5$ always outputs the comparison resultant signals $C_3$, $C_4$, $C_5$ of the H level, because the analog signal A is larger than either of the reference voltages of 0 V, −200 mV and −400 mV, as shown in FIGS. 12D to 12F.

Figure 13A:
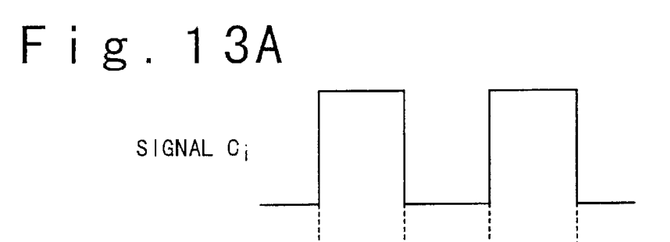
FIGS. 13A to 13D are timing charts to explain the operation of the rising edge detecting circuit in the signal processing apparatus according to the embodiment of the present invention.
Figure 13B:
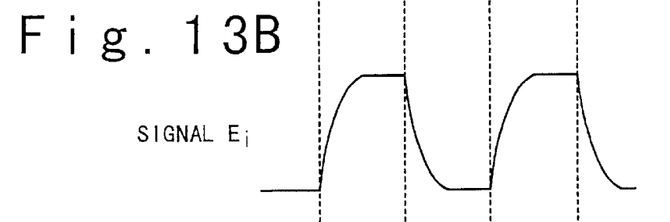
Figure 13C:
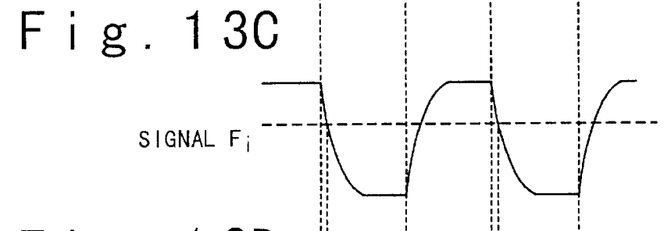
Figure 13D:
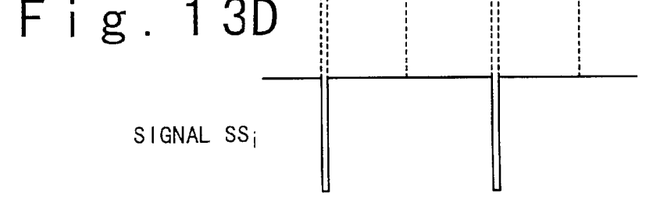

The operation of the rising edge detecting circuit $13_{2a}$ which inputs the comparison resultant signal $C_2$ from the comparing circuit $12_2$ is shown in FIGS. 13A to 13D. The comparison resultant signal $C_2$ shown in FIG. 13A is supplied to one of the input terminals of the NAND gate 22 and is supplied to the integrating circuit 20. The integrating circuit 20 makes the change of the rising and falling edges of the inputted comparison resultant signal $C_2$ gentle, as shown in FIG. 13B. The output $E_2$ of the integrating circuit 20 is inverted by the inverter 21 and is supplied to the other input terminal of the NAND gate as the signal $F_2$, as shown in FIG. 13C. The NAND gate 22 carries out an operation of the logic product of the inputted comparison resultant signal $C_2$ and the signal $F_2$ from the inverter 21 and inverts to outputs the calculation result as the rising edge detection signal $SS_2$, as shown in FIG. 13D. Because the logic product has a meaning only for the time delayed by the integrating circuit 20, the NAND gate 22 outputs a pulse signal $SS_2$ of the L level only for a predetermined delay time from the rising edge of comparison resultant signal $C_2$.

Figure 14A:
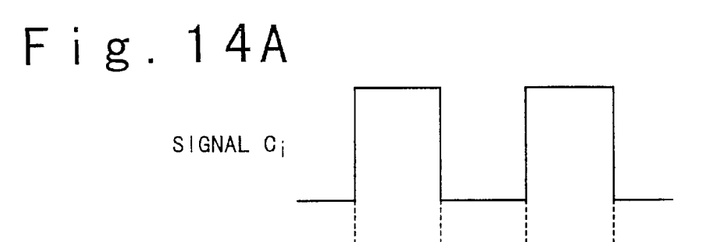
FIGS. 14A to 14D are timing charts to explain the operation of the falling edge detecting circuit in the signal processing apparatus according to the embodiment of the present invention.
Figure 14B:
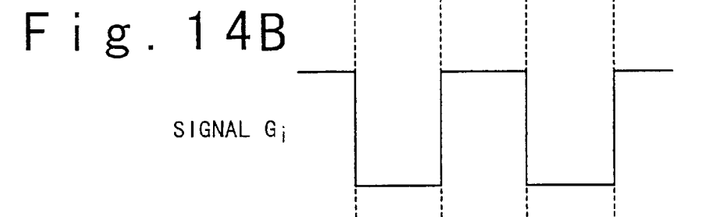
Figure 14C:
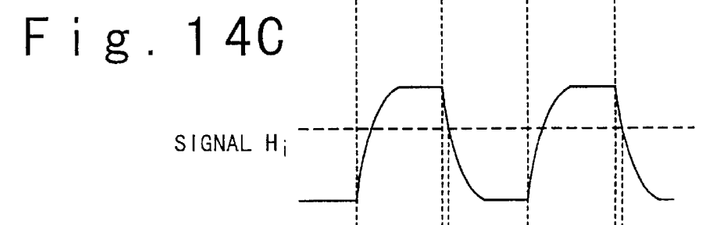
Figure 14D:
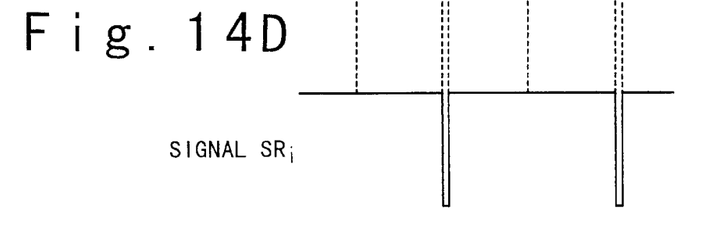
Figure 15A:
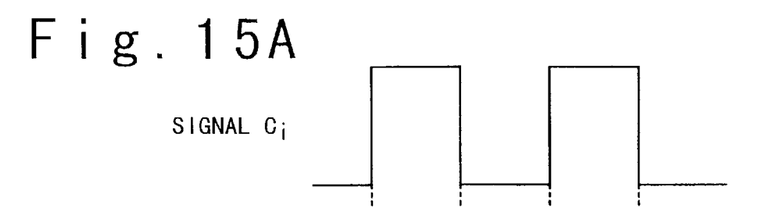
FIGS. 15A to 15D are timing charts to explain the operations of the rising edge detecting circuit, falling edge detecting circuit and flip to flop circuit in the signal processing apparatus according to the embodiment of the present invention.
Figure 15B:
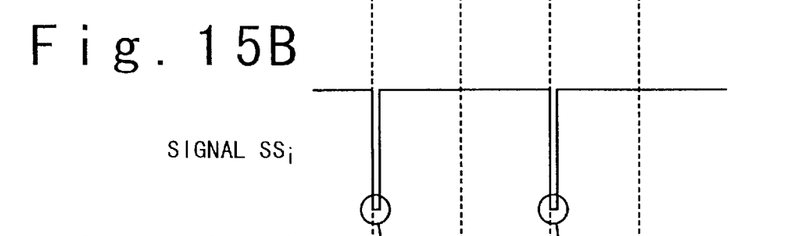
Figure 15C:
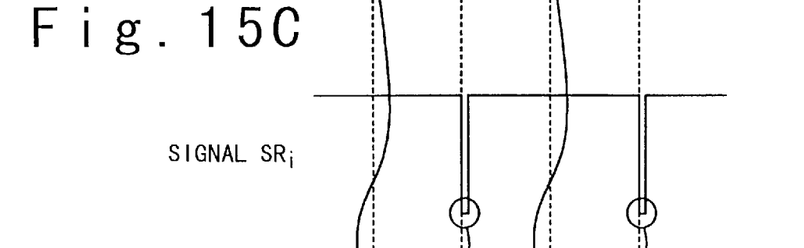
Figure 15D:
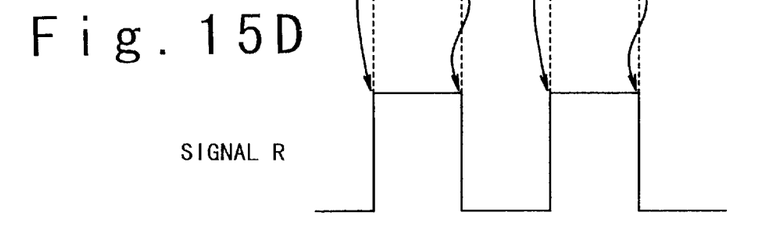

Also, the operation of $13_{2b}$ of the falling edge detecting circuits which input the comparison resultant signal $C_2$ from the comparing circuit $12_2$ is shown FIGS. 14A to 14D. The inputted comparison resultant signal $C_2$ is inverted by the inverter 21 and is supplied to one of the input terminals of the NAND gate 22 as the signal $G_2$, as shown in FIG. 14B. Also, the comparison resultant signal $C_2$ is supplied to the integrating circuit 20. The integrating circuit 20 makes the change of the rising and falling edges of the inputted comparison resultant signal $C_2$ gentle, as shown in FIG. 14C, and supplies to the other input terminal at the NAND gate as the signal $H_2$. The NAND gate 22 carries out an operation of the logic product in the output signal $H_2$ of the integrating circuit 31 and the output signal $G_2$ from the inverter 21, and inverts the calculation result to output as the falling edge detection signal $SR_2$, as shown in FIG. 14D. Because a logic product can be taken only for the time delayed by the integrating circuit 20, the NAND gate 22 outputs the pulse signal $SR_2$ of the L level only for a predetermined delayed time from the falling edge of the comparison resultant signal $C_2$.

In this case, since the comparison resultant signals $C_1$, $C_3$, $C_4$ and $C_5$ which are respectively inputted to the rising edge detecting circuits $13_{1a}$, $13_{3a}$, $13_{4a}$ and $13_{5a}$ do not change, the signals $SS_1$, $SS_3$, $SS_4$, $SS_5$ of the H level are always outputted from these circuits. Similarly, since the comparison resultant signals $C_1$, $C_3$, $C_4$ and $C_5$ which are respectively inputted to the falling edge detecting circuits $13_{1b}$, $13_{3b}$, $13_{4b}$ and $13_{5b}$ do not change too, the signals $SR_1$, $SR_3$, $SR_4$ and $SR_5$ of the H level are always output from these circuits.

Since the signal $SS_2$ from the rising edge detecting circuits $13_{2a}$ is supplied to the set terminal S2 of the flip-flop circuit 14 and the signal $SR_2$ from the falling edge detecting circuit $13_{2b}$ is supplied to the reset terminal $R_2$ of the flip-flop circuit 14, the flip-flop circuit 14 is set and reset in accordance with the change of the signal $C_2$ outputted from the comparing circuit $12_2$, as shown in FIGS. 15A to 15D. The digital signal R is outputted from the flip-flop circuit 14 to an external device.

Next, the case where the AC component of the analog signal a from the external device, e.g., the sensor element is 15 m$V_{P-P}$, the DC offset is 14 mV will be described below. In this case, it is supposed that the reference voltages generated by the reference voltage generating circuit $11_1$ to $11_5$ and the amplification of the amplifying circuit 10 are the same as the above example.

Figure 16A:
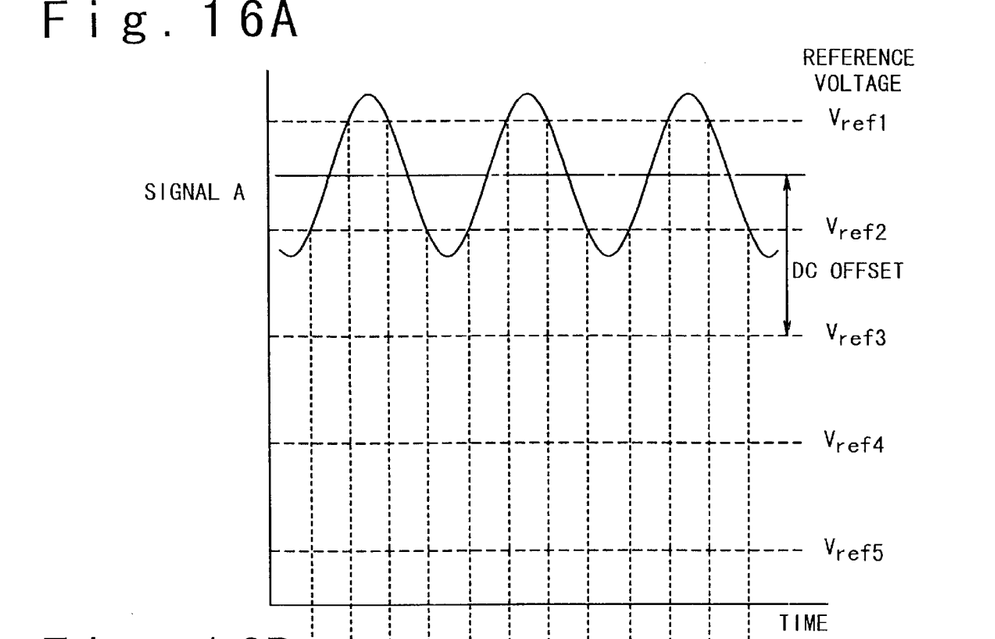
FIGS. 16A to 16F are timing charts to explain the operations of the amplifying circuit and comparing circuit in the signal processing apparatus according to the embodiment of the present invention.
Figure 16B:
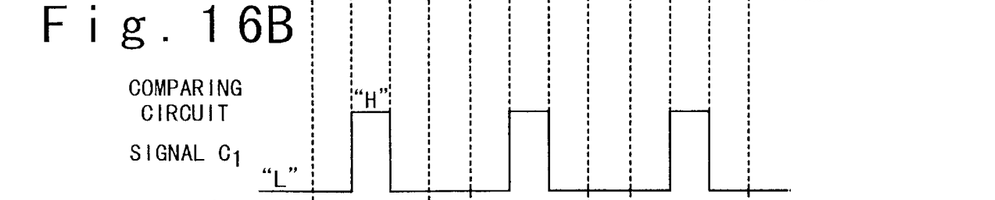
Figure 16C:
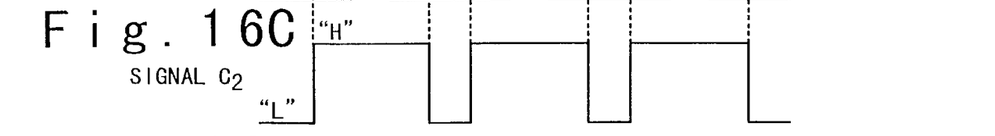
Figure 16D:
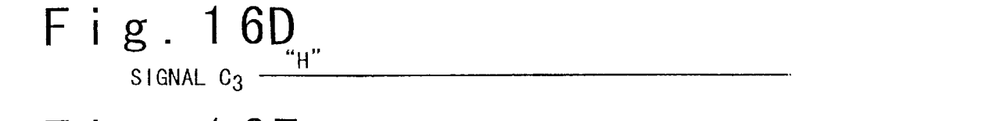
Figure 16E:
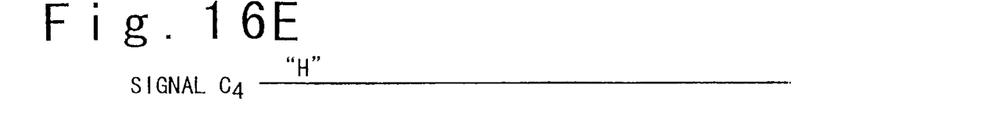
Figure 16F:
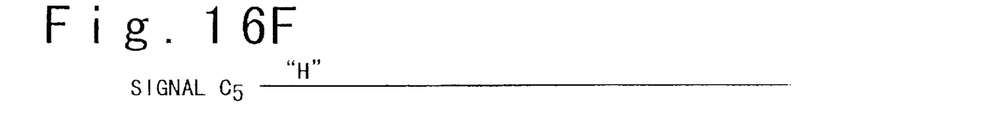

The amplifying circuit 10 amplifies the inputted analog signal a, and outputs the analog signal A having the peak to peak amplitude of 300 m$V_{P-P}$ in the AC component and the DC offset of 280 mV. Accordingly, the analog signal A crosses both of the reference voltages of +200 mV and +400 mV, as shown in FIG. 16A. In accordance with, the comparing circuit $12_1$ inputs the analog signal A from the amplifying circuit 10 and outputs the comparison resultant signal $C_1$ of the H level for the time interval when the analog signal A is larger than the reference voltage of +400 mV, and of the L level, otherwise, as shown in FIG. 16B. Similarly, the comparing circuit $12_2$ outputs the comparison resultant signal $C_2$ of the H level for the time interval when the analog signal A is larger than the reference voltage of +200 mV, and of the L level for the other time interval, as shown in FIG. 16C. The comparing circuits $12_3$ to $12_5$ always outputs the comparison resultant signals $C_3$, $C_4$ and $C_5$ of the H level, because the analog signal A is larger than either of the reference voltages of 0 V, −200 mV and −400 mV.

Figure 17A:
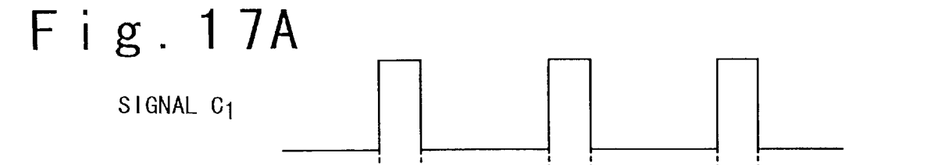
FIGS. 17A to 17G are timing charts to explain the operations of the rising edge detecting circuit, falling edge detecting circuit and flip to flop circuit in the signal processing apparatus according to the embodiment of the present invention.
Figure 17B:
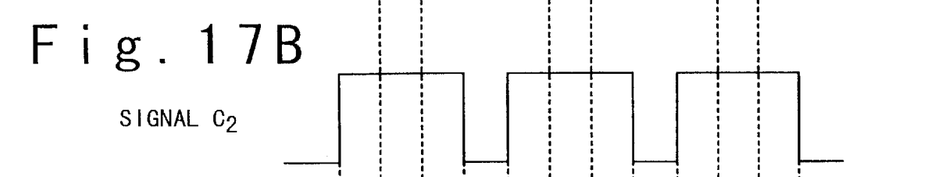
Figure 17C:
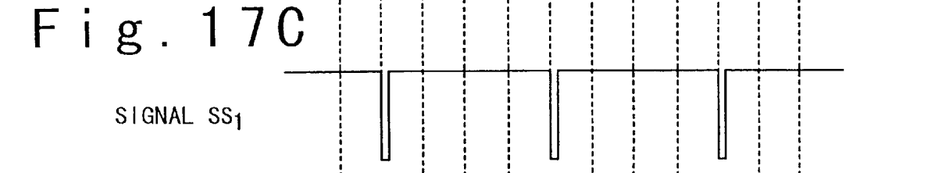
Figure 17D:
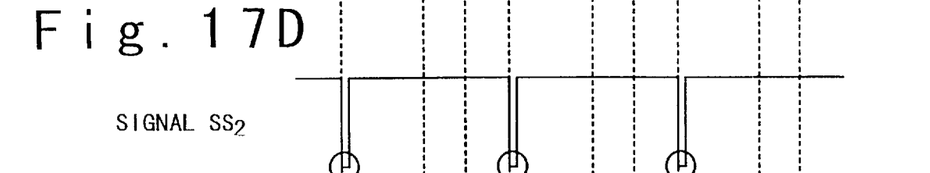

The rising edge detecting circuits $13_{1a}$ inputs the comparison resultant signal $C_1$ from the comparing circuit $12_1$, and outputs the pulse signal $SS_1$ of the L level only for a predetermined time interval from the rising edge of the inputted comparison resultant signal $C_1$, as shown in FIG. 17C. Similarly, the rising edge detecting circuit $13_{2a}$ inputs the comparison resultant signal $C_2$ from the comparing circuit $12_2$ and outputs the pulse signal $SS_2$ of the L level only for a predetermined time interval from the rising edge of the inputted comparison resultant signal $C_2$, as shown in FIG. 17D.

Figure 17E:
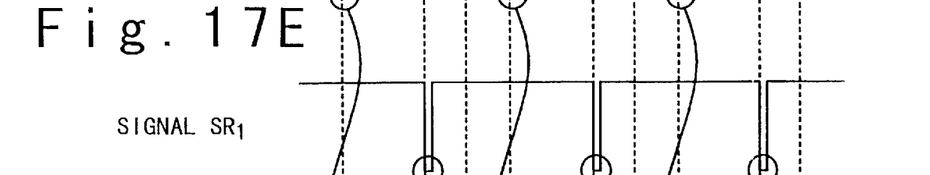
Figure 17F:
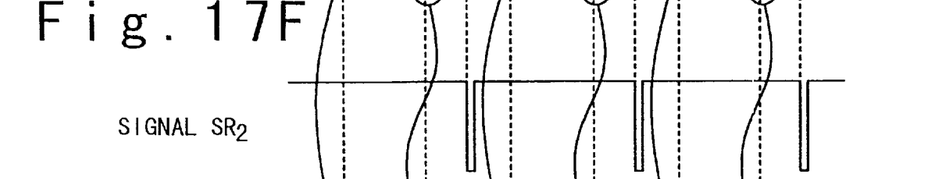

Also, the falling edge detecting circuit $13_{1b}$ inputs the comparison resultant signal $C_1$ from the comparing circuit $12_1$ and outputs the pulse signal $SR_1$ of the L level only for a predetermined delay time from the falling edge of the inputted comparison resultant signal $C_1$, as shown in FIG. 17E. Similarly, the falling edge detecting circuit $13_{2b}$ inputs the comparison resultant signal $C_2$ from the comparing circuit $12_2$ of the L level only for a predetermined delay time from the falling edge of the inputted comparison resultant signal $C_2$, and outputs the pulse signal $SR_2$, as shown in FIG. 17F. In this case, because the comparison resultant signals $C_3$, $C_4$ and $C_5$ which are respectively inputted to the rising edge detecting circuits $13_{3a}$, $13_{4a}$ and $13_{5a}$ do not change in level, the signals $SS_{3a}$, $SS_{4a}$ and $SS_{5a}$ of the H level are always outputted from these circuit. Similarly, because the comparison resultant signals $C_3$, $C_4$ and $C_5$ which are respectively inputted to the falling edge detecting circuits $13_{3b}$, $13_{4b}$ and $13_{5b}$ do not change, the signals $SR_3$, $SR_4$ and $SR_5$ of the H level are always outputted from these circuits.

Figure 17G:
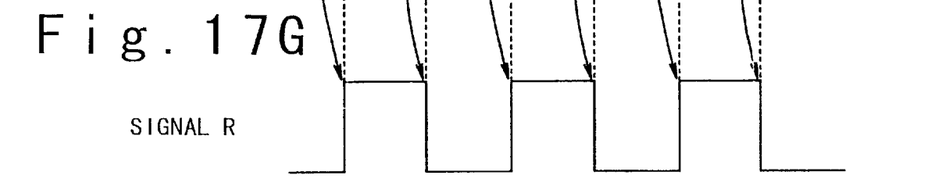

The signals $SS_1$ and $SS_2$ are outputted from the rising edge detecting circuit $13_{1a}$ and $13_{2a}$ to the set terminals $S_1$ and $S_2$ of the flip-flop circuit 14, and the signal $SR_1$ and $SR_2$ are outputted from the falling edge detecting circuits $13_{1b}$ and $13_{2b}$ to the reset terminals $R_1$ and $R_2$ of the flip-flop circuit 14, respectively. Therefore, the flip-flop circuit 14 changes the state, as shown in FIG. 17G. The digital signal R is output from the flip-flop circuit 14 to the external device.

The above-mentioned description was given to the examples when the AC component of the analog signal A crosses two reference voltages. However, when the AC component of the analog signal A crosses equal to or more than three reference voltages, too, the desired digital signal R can be obtained in the same manner.

Note that the comparing circuit $12_i$ in the above embodiments may be constructed to positively feed back the output signal. According to such a structure, the comparing circuit $12_i$ has a hysteresis and is superior in noise endurance.

Also, in the above embodiments, it is supposed that the amplification of the amplifying circuit 10 is 20 times, the amplitude of the AC component of the inputted analog signal is 10 m$V_{P-P}$, the DC offset is 50 mV in maximum, the potential difference between the adjacent reference voltages is 200 mV, and the number of reference voltages is 5. However, each of these parameters can be arbitrarily determined. That is, when the amplitude of the AC component of the inputted analog signal is α, the DC offset is β in maximum, and the amplification of the amplifying circuit 10 is γ, each of the above parameters can be determined to meet the following condition:

(the potential difference between adjacent reference voltages)$\leq \alpha \times \gamma$, and (the potential difference between adjacent reference voltages)×(the number of reference voltages)$\geq \beta \times \gamma$.

If the above condition is satisfied, then each of the operational amplifiers used as the amplifying circuit 10 and the comparing circuits $12_1$ to $12_5$ does not necessarily have high precision.

As described above in detail, according to the present invention, the signal processing apparatus can be provided without needing any adjustment and with low cost. Moreover, the signal processing apparatus is suitable for an integrated circuit.

What is claimed is:

1. A signal processing apparatus comprising:

N comparing circuits (N is an integer equal to or more than 2) respectively associated with reference voltages, wherein each of said comprising circuits generates a comparison resultant signal based on the associated reference voltage in response to input of a first analog signal;

N pulse generating circuits respectively provided for said N comparing circuits, wherein each of said N pulse generating circuits generates first and second pulse signals based on the corresponding comparison resultant signal supplied from the corresponding comparing circuit, said first and second pulse signals indicating signal level transitions of the corresponding comparison resultant signal with respect to the associated reference voltage; and a digital signal generating circuit for generating a digital signal in response to said first and second pulse signals of each of said N pulse generating circuits.

2. A signal processing apparatus according to claim 1, further comprising an amplifying circuit for amplifying an inputted second analog signal to supply to said N comparing circuits as said first analog signal.

3. A signal processing apparatus according to claim 2, wherein said second analog signal includes a DC offset, and wherein a voltage difference Vd between adjacent two of the reference voltages associated with said N comparing circuits satisfies:

$$Vd \leq \alpha \gamma \text{ and } Vd \geq \beta \gamma / N$$

where $\alpha$ is an amplitude of a component of said second analog signal other than the DC offset, $\beta$ is the DC offset of said second analog signal, $\gamma$ is an amplification of said amplifying circuit.

4. A signal processing apparatus according to claim 2, wherein each of said N comparing circuits has a hysteresis characteristic.

5. A signal processing apparatus according to claim 2, wherein each of said N pulse generating circuits includes a prevention circuit section for preventing an erroneous operation due to a pulse-like noise.

6. A signal processing apparatus according to claim 5, wherein each of said N pulse generating circuits includes:

a first pulse generating circuit for generating said first pulse signal which indicates a first level transition of the corresponding comparison resultant signal with respect to the associated reference voltage into a first direction; and a second pulse generating circuit for generating said second pulse signal which indicates a second level transition of the corresponding comparison resultant signal with respect to the associated reference voltage into a second direction which is opposite to the first direction, and wherein each of said first and second pulse generating circuits includes an integrating circuit.

7. A signal processing apparatus according to claim 6, wherein said first pulse generating circuit generates said first pulse signal simultaneously with the first level transition of the corresponding comparison resultant signal into the first direction, and said second pulse generating circuit generates second pulse signal simultaneously with the second level transition of the corresponding comparison resultant signal into the second direction.

8. A signal processing apparatus according to claim 2, wherein said N comparing circuits, said N pulse generating circuits, said digital signal generating circuit, and said amplifying circuit are formed in a same semiconductor chip.

9. A method of generating a digital signal from an analog signal containing a DC offset, comprising the steps of:

amplifying a first analog signal containing a DC offset to produce a second analog signal;

comparing said second analog signal with each of a plurality of reference voltages to generate a plurality of comparison resultant signals;

generating a first pulse signal in response to a first level transition of each of said plurality of comparison resultant signals from a first level region to a second level region;

generating a second pulse signal in response to a second level transition of each of said plurality of comparison resultant signals from the second level region to the first level region; and generating a digital signal set in response to said plurality of first pulse signals and rest in response to said plurality of second pulse signals.

10. A method according to claim 9, wherein a voltage difference between adjacent two of said plurality of reference voltages is determined from an amplitude of a component of said first analog signal other than the DC offset and an amplification in said amplifying step.

11. A method according to claim 9, wherein a voltage difference between adjacent two of said plurality of reference voltages is determined from the DC offset of said first analog signal and an amplification in said amplifying step.

12. A method according to claim 9, wherein said step of generating a first pulse signal includes generating said first pulse signal when each of said plurality of comparison resultant signals transits from said first level region to said second level region and stays in the second level region longer than a first predetermined time period, and wherein said step of generating a second pulse signal includes generating said second pulse signal when each of said plurality of comparison resultant signals transits from said second level region to said first level region and stays in the first level region longer than a second predetermined time period.

13. A method according to claim 12, wherein said step of generating a first pulse signal includes generating said first pulse signal simultaneous with the first level transition of each of said plurality of comparison resultant signals from said first level region to said second level region, and wherein said step of generating a second pulse signal includes generating said second pulse signal simultaneous with the second level transition of each of said plurality of comparison resultant signals from said second level region to said first region.

14. A method according to claim 9, wherein said step of generating a digital signal includes generating the digital signal set in response to the first one of said plurality of first pulse signals and reset in response to the first one of said plurality of second pulse signals.

15. A signal processing apparatus comprising:

a reference voltage generating circuit for generating N reference voltages (N is an integer equal to or more than 2);

N comparing circuits respectively provided for said N reference voltages, wherein each of said N comparing circuits compares a first analog signal with the corresponding reference voltage to output a comparison resultant signal in accordance with the comparing result, and said comparison resultant signal has a first level when an amplitude of said first analog signal is larger than the corresponding reference voltage, and a second level when the amplitude of said first analog signal is not larger than the corresponding reference voltage; and digital signal generating means for generating a digital signal set when either of said N comparison resultant signals which are outputted from said N comparing circuits changes from the second level into the first level and reset when either of said N comparison resultant signals changes from the first level into the second level.

16. A signal processing apparatus according to claim 15, further comprising an amplifying circuit for amplifying a second analog signal such that the amplified second analog signal crosses at least one of said N reference voltages generated by said reference voltage generating circuit, and for outputting the amplified second analog signal to said N comparing circuits as said first analog signal.

17. A signal processing apparatus according to claim 15, wherein said digital signal generating means includes:

N first detecting circuits respectively provided for said N comparing circuits, wherein each of said N first detecting circuits outputs a first detection signal when the corresponding comparison resultant signal from the corresponding comparing circuit changes from the second level into the first level; and N second detecting circuits respectively provided for said N comparing circuits, wherein each of said N second detecting outputs a second detection signal when the corresponding comparison resultant signal from the corresponding comparing circuit changes from the first level into the second level.

18. A signal processing apparatus according to claim 17, wherein each of said N first detecting circuits includes:

an integrating circuit for integrating the corresponding comparison resultant signal;

an inverter for inverting an output of said integrating circuit; and a NAND gate for outputting a logic product of the corresponding comparison resultant signal and the output of said inverter as the said first detection signal, and wherein each of said N second detecting circuits includes:

an integrating circuit for integrating the corresponding comparison resultant signal;

an inverter for inverting the corresponding comparison resultant signal; and a NAND gate for outputting a logic product of an output of said integrating circuit and an output of said inverter as said second detection signal.

19. A signal processing apparatus according to claim 18, wherein said digital signal generating means includes a flip-flop circuit which is set in responseto said first detection signal which is first outputted from either one of said N first detecting circuits, and reset in response to said second detection signal which is first outputted from either one of said N second detecting circuits.

20. A signal processing apparatus according to claim 16, wherein said second analog signal contains a DC offset, and wherein a voltage difference Vd between adjacent two of said N reference voltages satisfies:

$Vd \leq \alpha\gamma$ and $Vd \geq \beta\gamma/N$ where $\alpha$ is an amplitude of a component of said second analog signal other than the DC offset, $\beta$ is the DC offset of said second analog signal, and $\gamma$ is an amplification of the said amplifying circuit.

* * * * *